(12) United States Patent
Chung

(10) Patent No.: US 8,018,407 B2
(45) Date of Patent: Sep. 13, 2011

(54) LIGHT EMITTING DRIVER AND ELECTROLUMINESCENT DISPLAY INCLUDING SUCH LIGHT EMITTING DRIVER

(75) Inventor: Boyong Chung, Yongin-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 990 days.

(21) Appl. No.: 11/976,657

(22) Filed: Oct. 26, 2007

(65) Prior Publication Data

US 2008/0158109 A1    Jul. 3, 2008

(30) Foreign Application Priority Data

Dec. 29, 2006  (KR) .................. 10-2006-0138323

(51) Int. Cl.
  *G09G 3/32* (2006.01)
(52) U.S. Cl. ............... 345/82; 345/76; 345/96; 345/204
(58) Field of Classification Search ............. 345/76, 345/204–206, 211, 690, 98–100; 315/161, 315/169.3, 195, 299; 377/64, 70–84
See application file for complete search history.

(56) References Cited

U.S. PATENT DOCUMENTS

| | | | | |
|---|---|---|---|---|
| 5,949,271 A * | 9/1999 | Fujikura | .................. | 327/390 |
| 6,720,942 B2 * | 4/2004 | Lee et al. | .................. | 345/82 |
| 7,352,786 B2 * | 4/2008 | Ikeda | .................. | 372/38.01 |
| 7,420,535 B2 * | 9/2008 | Senda | .................. | 345/100 |
| 7,554,513 B2 * | 6/2009 | Sun et al. | .................. | 345/77 |
| 2004/0263469 A1 | 12/2004 | Senda | | |
| 2005/0141320 A1 | 6/2005 | Senda | | |

FOREIGN PATENT DOCUMENTS

KR  10-2005-0002583 A  1/2005
KR  10-2005-0065442 A  6/2005

* cited by examiner

*Primary Examiner* — Alexander Eisen
*Assistant Examiner* — Viet Pham
(74) *Attorney, Agent, or Firm* — Lee & Morse, P.C.

(57) ABSTRACT

A driver includes a first signal processor adapted to receive clock, input and negative input signals and to output a first output signal to a first node, a second signal processor adapted to receive the first output signal, a negative clock signal, and first and second negative feedback signals and to output a second output signal to a second node, a third signal processor adapted to receive the second output, the input and the clock signals and to output a third output signal to a third node and prevent first and second voltages from being simultaneously applied to the third node, a fourth signal processor adapted to receive the second and third output signals and to output a fourth output signal to a fourth node, and a fifth signal processor adapted to receive the third and fourth output signals and to output a fifth output signal to a fifth node.

25 Claims, 3 Drawing Sheets

LIGHT EMITTING DRIVER AND ELECTROLUMINESCENT DISPLAY INCLUDING SUCH LIGHT EMITTING DRIVER

CROSS-REFERENCE TO RELATED APPLICATIONS

Cross-reference is made to U.S. patent application Ser. No. 11/976,656 sharing a same U.S. filing date as this application.

BACKGROUND OF THE INVENTION

1. Field of the Invention

Embodiments of the present invention relate to a light emitting driver employable by an electroluminescent display and an electroluminescent display including such a light emitting driver. More particularly, embodiments of the invention relate to an electroluminescent display, e.g., an organic electroluminescent display, and a driver thereof that can decrease process/manufacturing cost, decrease process time, and improve manufacturing yield, by implementing a light emitting control driver employing a same transistor type as a pixel circuit of the electroluminescent display.

2. Description of the Related Art

Generally, organic electroluminescent displays are display devices that emit light by electrically exciting fluorescent or phosphorescent materials. Organic electroluminescent displays may drive N×M number of organic electroluminescent display elements to display an image. The organic electroluminescent element may include an anode, e.g., a transparent anode made of, for example, Indium Tin Oxide (ITO), an organic thin film and a cathode, e.g., an opaque cathode made of, for example, a metal. The organic thin film may have a multi-layered structure including an emitting layer (EML) for emitting light by combining electron(s) and hole(s), an electron transport layer (ETL) for transporting the electron(s) and a hole transport layer (HTL) for transporting the hole(s). Further, the organic thin film may include an electron injecting layer (EIL) for injecting the electron(s) and a hole injecting layer (HIL) for injecting the hole(s).

A technique for driving the organic electroluminescent device may include a passive matrix (PM) technique and an active matrix (AM) technique using a thin film transistor (TFT) or a MOSFET. The passive matrix technique may drive a light emitting cell including an anode and a cathode, which overlap each other, e.g., extend orthogonally to each other, by selecting a line. The active matrix driving technique may employ an active device, e.g., a TFT, and a capacitor, and may connect the TFT and the capacitor to respective indium tin oxide (ITO) pixel electrodes in order to maintain a voltage based on a capacitance of the capacitor. The active matrix technique may employ a voltage programming technique or a current programming technique depending on whether a signal applied from a data driver is a current or a voltage.

Organic electroluminescent displays may be used as displays in portable information terminals, e.g., personal computers, handsets, personal digital assistants (PDAs), or various kinds of information machines.

Recently, various kinds of light and small-sized light emitting displays compared to cathode-ray based displays have been developed. Electroluminescent displays, e.g., organic electroluminescent displays, having excellent light emitting efficiency, high luminance, excellent viewing angle, and a high response speed are being researched and developed.

A conventional voltage programming technique for driving, e.g., an organic electroluminescent display may include a light emitting control driver, including both p-type transistors, e.g., PMOS transistors, and n-type transistors, e.g., NMOS transistors. However, such light emitting control driving circuits including both PMOS and NMOS transistors, include a separate external driver and, fabrication thereof, include additional processing steps to accommodate both the n-type and p-type transistors. Therefore, the resulting organic electroluminescent display may be relatively large in size, relatively heavy, and manufacturing thereof may involve more complicated and/or lengthy processing.

SUMMARY OF THE INVENTION

Embodiments of the present invention are therefore directed to light emitting control drivers, and electroluminescent displays including such a light emitting control driver, which substantially overcome one or more of the problems due to the limitations and disadvantages of the related art.

It is therefore a feature of an embodiment of the present invention to provide light emitting drivers that include only transistors of one type, and more particularly, light emitting drivers that include only p-type or n-type transistors.

It is therefore a feature of a separate embodiment of the present invention to provide an electroluminescent display including a pixel circuit and a light emitting driver, which both include transistor(s) of a single type, e.g., n-type or p-type, thereby reducing processing cost, processing time, and/or improving yield.

It is therefore a feature of a separate embodiment of the present invention to provide a light emitting control driver in which strange symptoms such as power loss or heat generation in the light emitting control driver may be reduced and/or eliminated by selectively controlling a path between a first power source and a second power source such that the first and second power voltages may not be simultaneously applied to a node therebetween.

At least one of the above and other features and advantages of the present invention may be realized by providing a driver of an electroluminescent display, including a first signal processor adapted to receive a clock signal, an input signal and a negative input signal and to output a first output signal to a first node, a second signal processor adapted to receive the first output signal, a negative clock signal, a first negative feedback signal and a second negative feedback signal and to output a second output signal to a second node, a third signal processor adapted to receive the second output signal, the input signal and the clock signal and to output a third output signal to a third node, a fourth signal processor adapted to receive the second and third output signals and to output a fourth output signal to a fourth node, and a fifth signal processor adapted to receive the third and fourth output signals and to output a fifth output signal to a fifth node, wherein the third signal processor includes a switching element for preventing first and second power voltages from being applied to the third node simultaneously.

The first negative feedback signal may be the third output signal. The second negative feedback signal may be the fourth output signal. The first output signal may be output only when the clock signal is an enable signal. The second output signal may be output only when the negative clock signal is an enable signal. The first, second, third, fourth and fifth signal processors may be electrically coupled between the first and second power voltages. The fifth output signal may be an output signal of the driver. The fourth output signal may be a negative output signal of the driver.

The first signal processor may include a first switching element adapted to selectively supply the first power voltage based on the clock signal, a second switching element adapted to receive the input signal at a control electrode thereof to transfer the first power voltage supplied from the first switching element to the first node, a third switching element adapted to receive the input signal at a control electrode thereof, a first capacitive element including a first electrode that is electrically coupled to a first electrode of the third switching element and a second electrode that is electrically coupled to a second electrode of the third switching element, a fourth switching element including a control electrode that is electrically coupled to the first electrode of the third switching element and the first electrode of the first capacitive element and adapted to selectively transfer the second power voltage to the first node, a fifth switching element adapted to receive the negative input signal at a control electrode thereof and to selectively transfer the second power voltage to the control electrode of the fourth switching element, and a sixth switching element adapted to transfer the second power voltage to the fourth switching element based on the clock signal, wherein when the third switching element is in an on-state, the fourth switching element is in a diode-connected state.

The second signal processor may include a seventh switching element adapted to selectively supply the first power voltage based on the negative clock signal, an eighth switching element adapted to receive the third output signal at a control electrode thereof and to transfer the first power voltage supplied from the seventh switching element to the second node, a ninth switching element adapted to receive the third output signal at a control electrode thereof, a second capacitive element including a first electrode that is electrically coupled to a first electrode of the ninth switching element and a second electrode that is electrically coupled between a second electrode of the ninth switching element and the first node, a tenth switching element including a control electrode electrically coupled to the first electrode of the ninth switching element and the first electrode of the second capacitive element and adapted to selectively transfer the second power voltage to the second node, an eleventh switching element adapted to receive the fourth output signal at a control electrode thereof and to transfer the second power voltage to the control electrode of the tenth switching element, and a twelfth switching element adapted to selectively transfer the second power voltage to the tenth switching element based on the negative clock signal, wherein when the ninth switching element is in an on-state, the tenth switching element is in a diode-connected state.

The third signal processor may include a thirteenth switching element adapted to receive the second output signal at a control electrode thereof and to selectively transfer the first power voltage to the third node, a fourteenth switching element adapted to receive the input signal at a control electrode thereof and to selectively transfer the second power voltage to the third node, and a fifteenth switching element adapted to selectively transfer the second power voltage to the fourteenth switching element.

The fifteenth switching element may prevent the first and second power voltages from being simultaneously applied to the third node. The fourth signal processor may include a sixteenth switching element adapted to receive the third output signal at a control electrode thereof and to selectively transfer the first power voltage to the fourth node, and a seventeenth switching element adapted to receive the input signal at a control electrode thereof and to selectively transfer the second power voltage to the fourth node.

The fifth signal processor may include an eighteenth switching element adapted to receive the fourth output signal at a control electrode thereof and to selectively transfer the first power voltage to the fifth node, a nineteenth switching element adapted to receive the third output signal at a control electrode thereof and to selectively transfer the second power voltage to the fifth node, and a third capacitive element including a first electrode that is electrically coupled to the control electrode of the nineteenth switching element and a second electrode that is electrically coupled between a first electrode of the nineteenth switching element and the fifth node.

The first, second, third, fourth and fifth signal processors may include a plurality of switching elements that are all implemented as p-type transistors or n-type transistors. The clock signal may be one of a low level or a high level and the negative clock signal may be the other of the low level or the high level such that the clock signal and the negative clock signal may be opposite to each other, and the input signal may be one of a low level or a high level and the negative input signal may be the other of the low level or the high level such that the input signal and the negative input signal may be opposite to each other.

At least one of the above and other features and advantages of the present invention may be separately realized by providing an organic electroluminescent display, including a data driver supplying a data signal to a data line, a scan driver supplying a scan signal to a scan line, a light emitting control driver supplying a light emitting signal to a light emitting control line, a pixel circuit displaying an image using a pixel in a region that is defined by the data line, the scan line and the light emitting signal line, wherein the light emitting control driver includes a first signal processor adapted to receive a clock signal, an input signal and a negative input signal and to output a first output signal to a first node, a second signal processor adapted to receive the first output signal, a negative clock signal, a first negative feedback signal and a second negative feedback signal and to output a second output signal to a second node, a third signal processor adapted to receive the second output signal, the input signal and the clock signal and to output a third output signal to a third node, a fourth signal processor adapted to receive the second and third output signals and to output a fourth output signal to a fourth node, and a fifth signal processor adapted to receive the third and fourth output signals and to output a fifth output signal to a fifth node, wherein the third signal processor includes a switching element for preventing first and second power voltages from being applied to the third node simultaneously.

The light emitting control driver may include a plurality of switching elements that are of a same transistor-type as a switching element of the pixel circuit.

BRIEF DESCRIPTION OF THE DRAWINGS

The above and other features and advantages of embodiments of the present invention will become more apparent to those of ordinary skill in the art by describing in detail exemplary embodiments thereof with reference to the attached drawings, in which.

DETAILED DESCRIPTION OF EXEMPLARY EMBODIMENTS

Figure 1:
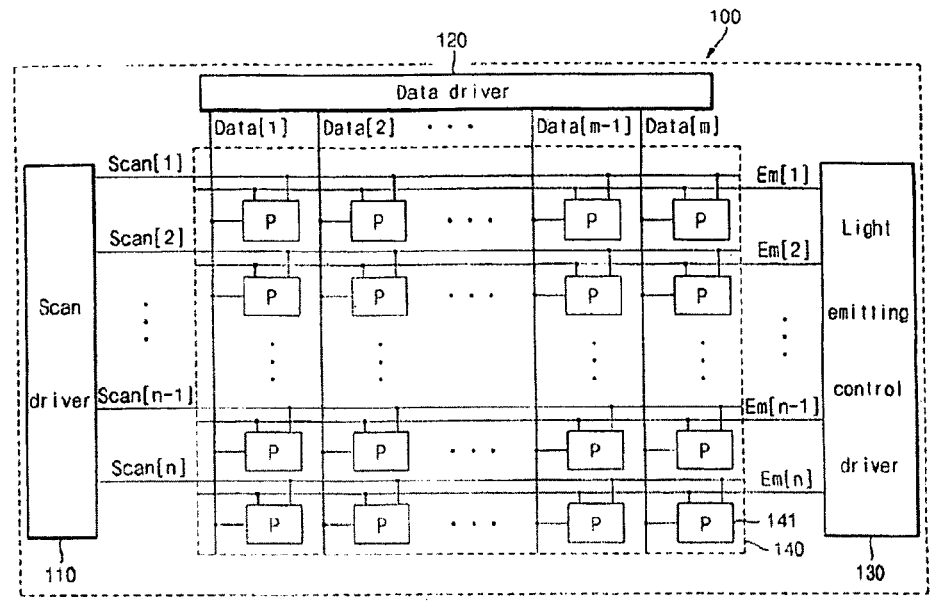
FIG. 1 illustrates a schematic diagram of an electroluminescent display according to an exemplary embodiment of the present invention.

Korean Patent Application No. 10-2006-0138323 filed on Dec. 29, 2006 in the Korean Intellectual Property Office (KIPO), and entitled: "Organic Electroluminescent Display and Driver Thereof," is incorporated by reference herein in its entirety.

Hereinafter, exemplary embodiments of the present invention will be described in detail with reference to the accompanying drawing. The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims. Like reference numerals refer to like elements throughout the specification.

In the figures, the dimensions of regions may be exaggerated for clarity of illustration. It will also be understood that when an element is referred to as being "connected to," "coupled to," or "between" another layer(s) or substrate(s), it can be directly connected to, directly coupled to or directly between the other element, or intervening elements may also be present.

FIG. 1 illustrates a schematic diagram of an exemplary electroluminescent display, e.g., an organic electroluminescent display 100, according to an exemplary embodiment of the present invention.

Referring to FIG. 1, the organic electroluminescent display 100 may include a scan driver 110, a data driver 120, a light emitting control driver 130, and an electroluminescent display panel 140, e.g., an organic electroluminescent display panel (hereafter, referred to as "panel").

The panel 140 may include a plurality of scan lines (Scan[1], Scan[2], . . . , Scan[n]) and a plurality of light emitting control lines (Em[1], Em[2], . . . , and Em[n] arranged to extend in a column direction, and a plurality of data lines (Data[1], Data[2], . . . , and Data[m]) arranged to extend in a row direction. The panel 140 may include a plurality of pixel circuits 141, and the pixel circuits 141 may be at least partially defined by or arranged between corresponding respective portions of the plurality of scan lines (Scan[1], Scan[2], . . . , and Scan[n]), the plurality of data lines (Data[1], Data[2], . . . , and Data[m]) and the plurality of light emitting control lines (Em[1], Em[2], . . . , and Em[n]). More particularly, e.g., each of the pixel circuits 141 may be formed in a pixel region defined by two respective ones of the adjacent scan lines (or light emitting control lines) and two respective adjacent data lines.

The scan driver 110 may sequentially supply a respective scan signal(s) to the panel 140 through the plurality of scan lines (Scan[1], Scan[2], . . . , Scan[n]). That is, the scan signal(s) may be supplied from the scan driver 110 to the respective scan line(s) (Scan[1], Scan[2], . . . , and Scan[n]).

The data driver 120 may supply a respective data signal(s) to the panel 140 through the plurality of data lines (Data[1], Data[2], . . . , Data[m]). That is, the data signal(s) may be supplied from the data driver 120 to the respective data line(s) (Data[1], Data[2], . . . , and Data[m]).

The light emitting control driver 130 may sequentially supply a respective light emitting control signal to the panel 140 through the plurality of light emitting control lines (Em[1], Em[2], . . . , and Em[n]). That is, the light emitting control signal(s) may be supplied from the light emitting control driver 130 to the respective light emitting control line(s) (Em[1], Em[2], . . . , and Em[n]).

The light emitting control driver 130 may control a pulse width of the respective light emitting control signal and control a number of pulses of the light emitting control signal generated during one interval.

The pixel circuit(s) 141 may be connected with the respective light emitting control line (Em[1], Em[2], . . . , Em[n]). Each pixel circuit 141 may receive the respective light emitting control signal and may control when a current generated from the pixel circuit 141 flows into a light emitting element thereof. The pixel circuit(s) 141 may include, e.g., a plurality of transistors of a same type, e.g., p-type transistors, a capacitive element(s), e.g., capacitor(s), and light emitting element, e.g., organic light emitting diode.

Figure 2:
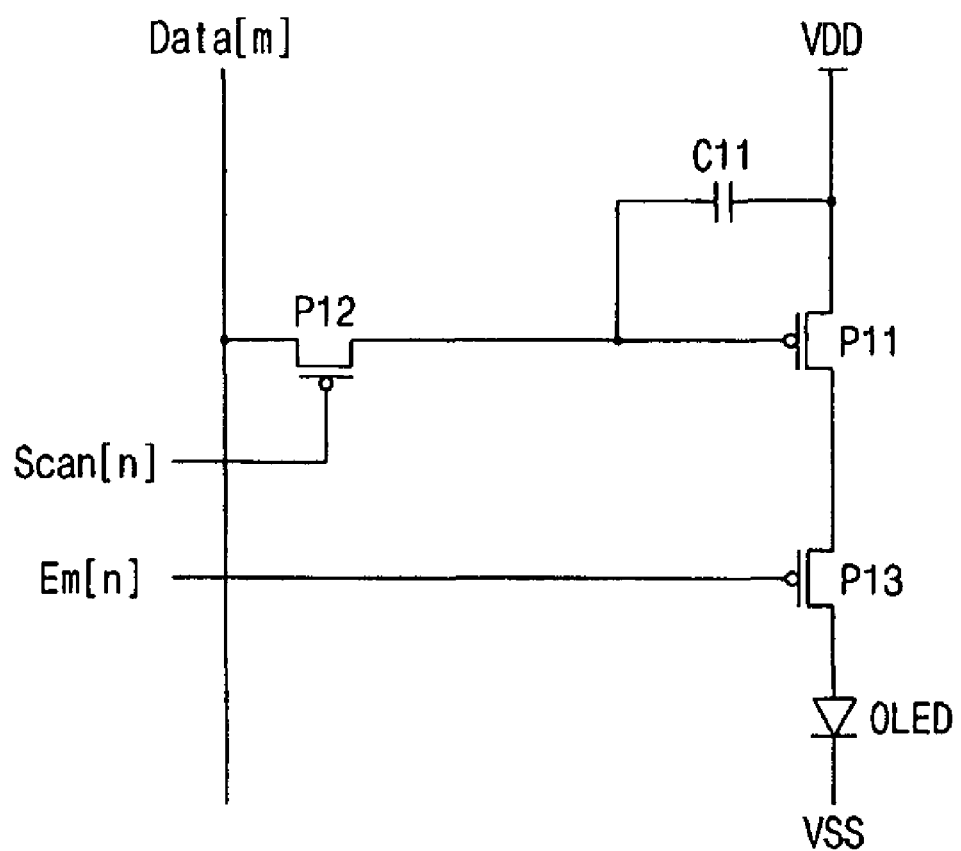
FIG. 2 illustrates a circuit diagram of a pixel circuit according to an exemplary embodiment of the present invention.

FIG. 2 illustrates an example embodiment of one of the N×M number of pixel circuits of organic electroluminescent display 100.

Referring to FIG. 2, a driving transistor P11 is connected to a second switching element P13 so as to supply a driving current for emitting light to the organic electroluminescence diode (OLED). An amount of a current flowing through the driving transistor P11 may be controlled by a data voltage applied through a first switching element P12. A capacitive element C11 is connected between a gate of the driving transistor P11 and a source thereof, so as to maintain the applied voltage during a constant period. A first electrode of the first switching element P12 is connected to a data line (Data[m]) and a control electrode thereof is connected to a scan line (Scan[n]). A second switching element P13 may transfer a current supplied from the driving transistor P11 to the OLED in response to a light emitting control signal.

An operation of the pixel circuit will be explained below.

When the first switching element P12 is turned on in response to a scanning signal applied to a control electrode of the first switching element P12, a data voltage from the data line (Data[m]) is applied to the control electrode of the driving transistor P11. Then, a driving current (IOLED) that corresponds to a voltage (VGS) charged between a gate of the driving transistor P11 and a source thereof flows in a drain of the driving transistor P11. The OLED emits light due to the driving current (IOLED), when the second switching element P13 is turned on by the light emitting control signal.

Referring back again to FIG. 1, in embodiments of the invention, the light emitting control driver 130 may be implemented with transistors of a same type as the transistor(s) of the pixel circuit 141, i.e., while the light emitting control driver 130 and the pixel circuit 141 may include other elements, e.g., a capacitor, each may only include transistors of a single and same type. That is, in embodiments of the invention, e.g., when the pixel circuit 141 includes only p-type transistors, i.e., no n-type transistors, the light emitting control driver 130 may be implemented with only p-type transistors, i.e. no n-type transistors, and when the pixel circuit 141 includes only n-type transistors, i.e., no p-type transistors, the light emitting control driver 130 may be implemented with only n-type transistors, i.e., no p-type transistors. Accordingly, when the panel 140 is formed, the light emitting control driver 130 may be formed on a same substrate and using a same process as the pixel circuit(s) 141. Thus, e.g., in embodiments of the invention, a separate process and/or a separate chip is/are not required for implementing the light emitting control driver 130.

Figure 4:
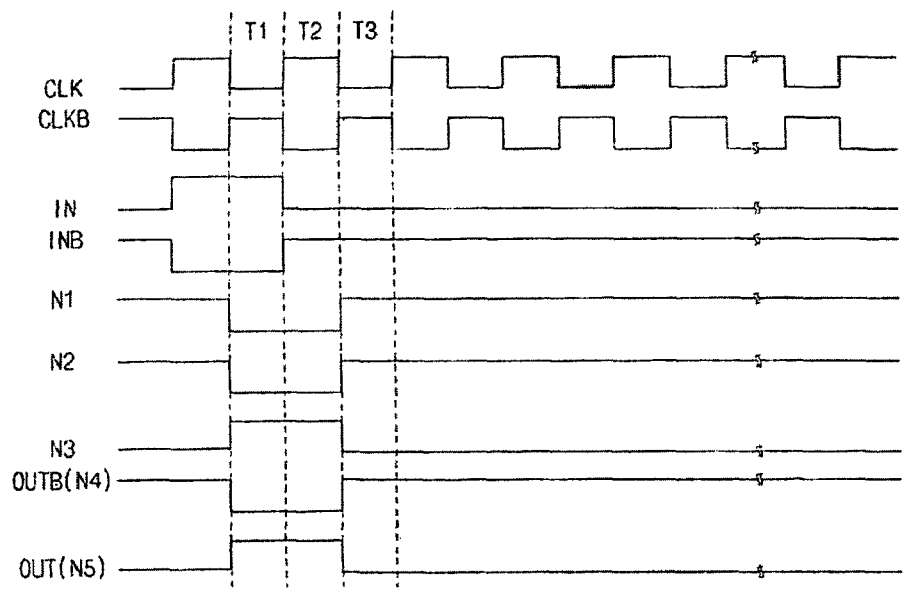
FIG. 4 illustrates a timing diagram of signals that may be employed to operate the light emitting control driver shown in FIG. 3.

FIG. 4 illustrates a circuit diagram of a light emitting control driver 430 according to an exemplary embodiment of the present invention.

Figure 3:
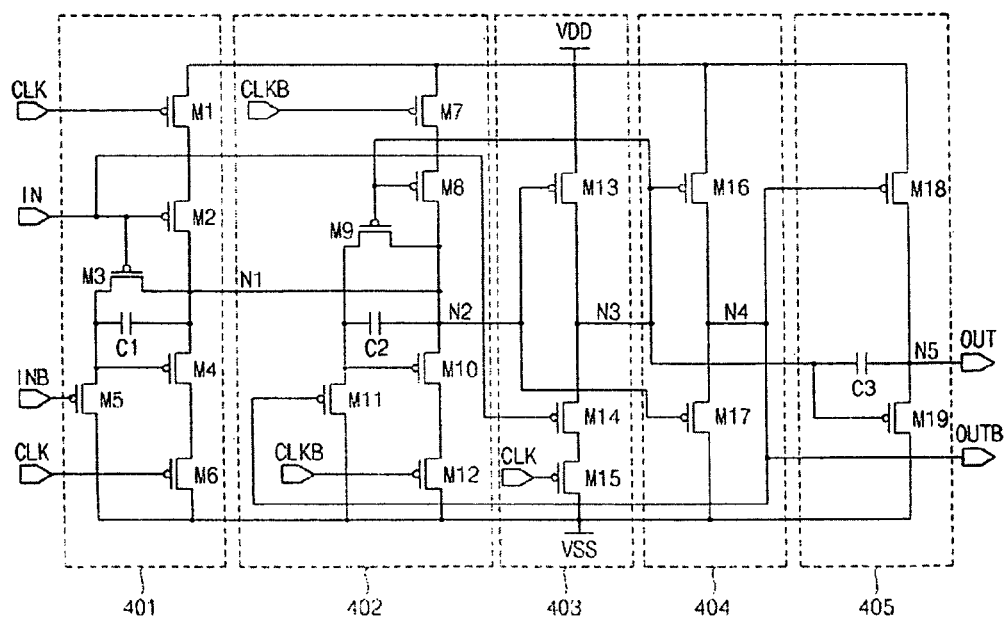
FIG. 3 illustrates a circuit diagram of a light emitting control driver according to an exemplary embodiment of the present invention.

Referring to FIG. 3, the light emitting control driver 430 may include a first signal processor 401, a second signal processor 402, a third signal processor 403, a fourth signal processor 404 and a fifth signal processor 405. The light emitting control driver 430 may include or may be connected to a first power voltage VDD source and a second power voltage VSS source to respectively receive the first power voltage VDD and the second power voltage VSS. The light emitting control driver 430 may receive an input signal IN, a negative input signal INB, a clock signal CLK and a negative clock signal CLKB, and may output an output signal OUT, e.g., a fifth output signal, and a negative output signal, e.g., a fourth output signal. In some embodiments of the invention, when the input signal IN is at a high level, the negative input signal INB is at a low level, and when the input signal IN is at a low level, the negative input signal INB is at a high level. On the other hand, in such embodiments, when the clock signal CLK is at a high level, the negative clock signal CLKB is at a low level, and when the clock signal CLK is at a low level, the negative clock signal CLKB is at a high level. When the clock signal CLK and the negative clock signal CLKB are at the low level, a switch receiving such a signal may be turned on, i.e., enabled.

The first power voltage VDD may be supplied to the first, second, third, fourth and fifth signal processors 401, 402, 403, 404 and 405.

The second power voltage VSS may be supplied to the first, second, third, fourth, and fifth signal processors 401, 402, 403, 404 and 405.

The first signal processor 401 may receive the clock signal CLK, the input signal IN and the negative input signal INB, and may output a first output signal to a first node N1. The first signal processor 401 may include first, second, third, fourth, fifth and sixth switching elements M1, M2, M3, M4, M5, M6 and a first capacitive element C1, e.g., a capacitor.

The first switching element M1 may include a first electrode, i.e., drain electrode or source electrode, that is electrically coupled to the first power voltage VDD, a second electrode, i.e., drain electrode or source electrode, that is electrically coupled to the second switching element M2, and a control electrode (i.e., gate electrode) to which the clock signal CLK may be applied. The first switching element M1 may be turned on by inputting the clock signal CLK at a low level to the control electrode thereof, so as to supply the first power voltage VDD to the second switching element M2.

The second switching element M2 may include a first electrode that is electrically coupled to the second electrode of the first switching element M1, a second electrode that is electrically coupled to the third switching element M3, and a control electrode to which the input signal IN may be applied. The second switching element M2 may be turned on by inputting the input signal IN at a low level to the control electrode thereof, so as to supply the first power voltage VDD via the first switching element M1 to the first node N1 as the first output signal.

The third switching element M3 may include a first electrode that is electrically coupled to a first electrode of the first capacitive element C1, a second electrode that is electrically coupled to a second electrode of the first capacitive element C1, and a control electrode to which the input signal IN may be applied. The third switching element M3 may be turned on by inputting the input signal IN at a low level to the control electrode thereof so as to connect the fourth switching element M4 in a diode-connected manner. As a result of the diode-connected fourth switching element M4, the second power voltage VSS may not be supplied to the first node N1.

The fourth switching element M4 may include a control electrode that is electrically coupled between the first electrode of the first capacitive element C1 and the fifth switching element M5, a first electrode that is electrically coupled to the second electrode of the first capacitive element C1, and a second electrode that is electrically coupled to the sixth switching element M6. The fourth switching element M4 may be a driving transistor. For example, the fourth switching element M4 may function as a diode for flowing a current from the first power voltage VDD source towards the first node N1 and the second power voltage VSS source when the third switching element M3 is turned on, and may function as a diode for flowing a current from the second power voltage VSS source towards the first node N1 and the first power voltage VDD source when the fifth and sixth switching elements M5 and M6 are turned on.

The fifth switching element M5 may include a first electrode that is electrically coupled between the first electrode of the first capacitive element C1 and the control electrode of the fourth switching element M4, a second electrode that is electrically coupled to the second power voltage VSS, and a control electrode to which the negative input signal INB may be applied. The fifth switching element M5 may be turned on by inputting the negative input signal INB at a low level to the control electrode thereof, so as to connect the fourth switching element M4 in a diode-connected manner.

The sixth switching element M6 may include a first electrode that is electrically coupled to the second electrode of the fourth switching element M4, a second electrode that is electrically coupled to the second power voltage VSS, and a control electrode to which the clock signal CLK may be supplied. The sixth switching element M6 may be turned on by inputting the clock signal CLK at a low level to the control electrode thereof, so as to supply the first power voltage VSS to the fourth switching element M4.

As discussed above, the first electrode of the first capacitive element C1 may be electrically coupled to the first electrode of the third switching element M3, and the second electrode of the first capacitive element C1 may be electrically coupled to the second electrode of the third switching element M3. The first capacitive element C1 may store a threshold voltage of the fourth switching element M4, when the fifth switching element M5 is turned on to connect the fourth switching element M4 in a diode-connected manner. The threshold voltage stored in the first capacitive element C1 may compensate for a voltage loss that may result from the diode-connected structure of the fourth switching element M4 such that the first signal processor 401 may output the second power voltage VSS as the first output signal at the first node N1.

The second signal processor 402 may receive the first output signal, e.g., the second power voltage VSS, via the first node N1, the negative clock signal CLKB, a first negative feedback signal, i.e., a third output signal from the third signal processor 403, and a second negative feedback signal, i.e., a fourth output signal OUTB from the fourth signal processor 404, so as to output a second output signal to a second node N2. The second signal processor 402 may include seventh, eighth, ninth, tenth, eleventh, and twelfth switching elements M7, M8, M9, M10, M11, M12 and a second capacitive element C2.

The first output signal may be output to the second node N2 when the clock signal CLK is at a low level, i.e., when the negative clock signal CLKB is at a high level. The first output signal may be output to the second node N2 by the first negative feedback signal and the second negative feedback signal, when the clock signal CLK is at a high level, i.e., when the negative clock signal CLKB is at a low level. In other words, the first and second output signals may form the second output signal every half cycle of the clock signal CLK.

The seventh switching element M7 may include a first electrode that is electrically coupled to the first power voltage VDD, a second electrode that is electrically coupled to the eighth switching element M8, and a control electrode to which the negative clock signal CLKB may be supplied. The seventh switching element M7 may be turned on by inputting the negative clock signal CLKB at a low level to the control electrode thereof, so as to supply the first power voltage VDD to the eighth switching element M8.

The eighth switching element M8 may include a first electrode that is electrically coupled to the second electrode of the seventh switching element M7, a second electrode that is electrically coupled to the ninth switching transistor M9, and a control electrode to which the first negative feedback signal, i.e., the third output signal from a third node N3, may be applied. The eighth switching element M8 may be turned on by inputting the first negative feedback signal at a low level to the control electrode thereof, so that the first power voltage VDD supplied from the seventh switching element M7 may be applied to the second node N2, i.e., as the second output signal corresponding to the second signal processor 402. As discussed above, in some embodiments, the first node N1 may be electrically coupled to the second node N2, and thus, the first output signal and the second output signal at the first and second nodes N1, N2, respectively, may be the same.

The ninth switching element M9 may include a first electrode that is electrically coupled to a first electrode of the second capacitive element C2, a second electrode that is electrically coupled to a second electrode of the second capacitive element C2, and a control electrode to which the first negative feedback signal may be supplied. The ninth switching element M9 may be turned on by inputting the first negative feedback signal from the third node N3 at a low level to the control electrode so as to connect the tenth switching element M10 in a diode-connected manner such that the second power voltage VSS may not be supplied, via the diode-connected tenth switching element M10, to the second node N2.

The tenth switching element M10 may include a control electrode that is electrically coupled between the first electrode of the second capacitive element C2 and the eleventh switching element M11, a first electrode that is electrically coupled to the second electrode of the second capacitive element C2, and a second electrode that is electrically coupled to the 12th switching element M12. The tenth switching element M10 may be a driving transistor. For example, the tenth switching element M10 may be diode-connected and may function as a diode for flowing a current from the first power voltage VDD source towards the second power voltage VSS source when the ninth switching element M9 is turned on, and may function as a diode for flowing a current from the second power voltage VSS source towards the first power voltage VDD source when the eleventh switching element M11 and the twelfth switching element M12 are turned on.

The eleventh switching element M11 may include a first electrode that is electrically coupled between the first electrode of the second capacitive element C2 and the control electrode of the tenth switching element M10, a second electrode that is electrically coupled to the second power voltage VSS, and a control electrode to which the second negative feedback signal from the fourth node N4 may be supplied. The eleventh switching element M11 may be turned on by inputting the second negative feedback signal at a low level to the control electrode thereof so as to connect the tenth switching element M10 in a diode-connected manner.

The twelfth switching element M12 may include a first electrode that is electrically coupled to the second electrode of the tenth switching element M10, a second electrode that is electrically coupled to the second power voltage VSS, and a control electrode to which the negative clock signal CLKB may be supplied. The twelfth switching element M12 may be turned on by inputting the negative clock signal CLKB at a low level to the control electrode thereof, so that the second power voltage VSS may be applied to the tenth switching element M10.

The first electrode of the second capacitive element C2 may be electrically coupled to the first electrode of the ninth switching element M9, and the second electrode of the second capacitive element C2 may be electrically coupled to the second electrode of the ninth switching element M9. The second capacitive element C2 may store the threshold voltage of the tenth switching element M10 when the eleventh switching element M11 is turned such that the tenth switching element M10 may be connected in a diode-connected manner. The threshold voltage stored in the second capacitive element C2 may compensate for a voltage loss that may result from the diode-connected structure of the tenth switching element M10 such that the second signal processor 402 may output the second power voltage VSS as the second output signal at the second node N2.

The third signal processor 403 may receive the clock signal CLK, the second output signal and the input signal IN, and may output the third output signal, i.e., a negative signal of the second output signal at the second node N2, to the third node N3. The third signal processor 403 may include thirteenth, fourteenth and fifteenth switching elements M13, M14, M15.

The thirteenth switching element M13 may include a first electrode that is electrically coupled to the first power voltage VDD, a second electrode that is electrically coupled to the fourteenth switching element M14 and the third node N3, and a control electrode to which the second output signal may be supplied. The thirteenth switching element M13 may be turned on by inputting the second output signal at a low level to the control electrode thereof, so that the first power voltage VDD may be supplied to the third node N3.

The fourteenth switching element M14 may include a first electrode that is electrically coupled to the third node N3, a second electrode that is electrically coupled to the fifteenth switching element M15, and a control electrode to which the input signal IN may be supplied. The fourteenth switching element M14 may be turned on by inputting the input signal IN at a low level to the control electrode thereof, so that the second power voltage VSS, which may be supplied from the fifteenth switching element M15, may be applied to the third node N3.

The fifteenth switching element M15 may include a first electrode that is electrically coupled to the second electrode of the fourteenth switching element M14, a second electrode that is electrically coupled to the second power voltage VSS, and a control electrode to which the clock signal CLK may be supplied. The fifteenth switching element M15 may be turned on by inputting the clock signal CLK at a low level to the control electrode thereof so as to supply the second power voltage VSS to the fourteenth switching element M14. Further, the fifteenth switching element M15 may be turned off by inputting the clock signal CLK at a high level to the fifteenth switching element M15 so as to block a path between the second power voltage VSS source and the fourteenth switching element M14 via the fifteenth switching element M15. By providing, e.g., such a switching element, e.g., the fifteenth switching element M15, that may selectively block, i.e., when the fifteenth switching element M15 is turned off, a supply of the second power voltage VSS to the third node N3, it is possible to prevent the first power voltage VDD and the second power voltage VSS from being simultaneously supplied to the third node N3, i.e., to prevent having a current path between the first power voltage VDD source and the second power voltage VSS source.

The fourth signal processor 404 may receive the second and third output signals and may output the fourth output signal OUTB to the fourth node N4. The fourth signal processor 404 may include sixteenth and seventeenth switching elements M16 and M17.

The sixteenth switching element M16 may include a first electrode that is electrically coupled to the first power voltage VDD, a second electrode that is electrically coupled to the seventeenth switching element M17 and the fourth node N4, and a control electrode that is electrically coupled to the third node N3. The sixteenth switching element M16 may be turned on by inputting the third output signal, from the third node N3, at a low level to the control electrode thereof so as to supply the first power voltage VDD to the fourth node N4.

The seventeenth switching element M17 may include a first electrode that is electrically coupled to the fourth node N4, a second electrode that is electrically coupled to the second power voltage VSS, and a control electrode that is electrically coupled to the second node N2. The seventeenth switching element M17 may be turned on by inputting the second output signal N2 at a low level to the control electrode thereof so as to supply the second power voltage VSS to the fourth node N4.

The fifth signal processor 405 may receive the third output signal from the third node N3 and the fourth output signal OUTB and may output the fifth output signal OUT to a fifth node N5. The fifth signal processor 405 may include an eighteenth switching element M18 and a nineteenth switching element M19, and a third capacitive element C3.

The eighteenth switching element M18 may include a first electrode that is electrically coupled to the first power voltage VDD, a second electrode that is electrically coupled to the nineteenth switching element M19 and the fifth node N5, and a control electrode that is electrically coupled to the fourth node N4. The eighteenth switching element M18 may be turned on by inputting the fourth output signal OUTB at a low level to the control electrode thereof, so that the first power voltage VSS may be supplied to the fifth node N5.

The nineteenth switching element M19 may include a first electrode that is electrically coupled to the fifth node N5, a second electrode that is electrically coupled to the second power voltage VSS, and a control electrode that is electrically coupled to the third node N3. The nineteenth switching element M19 may be turned on by inputting the third output signal to the control electrode thereof, so that the second power voltage VSS may be supplied to the fifth node N5.

The third capacitive element C3 may include a first electrode that is electrically coupled to the control electrode, e.g., gate, of the nineteenth switching element M19, and a second electrode that is electrically coupled to the first electrode, e.g., source, of the nineteenth switching element M19. The third capacitive element C3 may store a voltage between a gate and a source of the nineteenth switching element M19 when the nineteenth switching element M19 is turned on to supply the second power voltage VSS to the fifth node N5. During this time, a voltage between the gate and the source of the nineteenth switching element M19 may be stored in the third capacitive element C3 as a voltage between the third node N3 and the fifth node N5, and the stored voltage may compensate for a voltage that is lost when the second power voltage VSS is applied to the fifth node N5 via the nineteenth switching element M19.

In embodiments of the invention, the pixel circuit 141 and the light emitting control driver 130 may be constituted of transistors of a same type, e.g., all n-type transistors or all p-type transistors, in order to simplify formation of the light emitting control driver 130 and the pixel circuit 141 on a single substrate. As a result, e.g., a size, weight and/or manufacturing cost of the organic electroluminescent display 100 may be reduced by forming the pixel circuit 141 and the light emitting control driver 130 on the same substrate. In the exemplary embodiment illustrated in FIG. 3, the light emitting control driver 130 includes transistors of only p-type, e.g., PMOS transistors. Accordingly, in some embodiments of the invention, when the light emitting control driver 130 is formed on the same substrate as the pixel circuit 141 including transistors of only the same type, e.g., p-type transistors such as PMOS transistors, the manufacturing process may be simplified.

FIG. 4 illustrates a timing diagram of signals that may be employed to operate the light emitting control driver shown in FIG. 3. More particularly, the state of exemplary signals that may be supplied and/or generated during, e.g., exemplary first, second and third driving periods T1, T2, T3 will be described below.

During a first driving period T1, a clock signal CLK may be at a low level, a negative clock signal CLKB may be at a high level, an input signal IN may be at a high level, and a negative input signal INB may be at a low level In the first signal processor 401 (referring to FIG. 3), during the first driving period T1, the first switching element M1, the fifth switching element M5 and the sixth switching element M6 may be turned on, and the second and third switching elements M2 and M3 may be turned off. When the fifth and sixth switching elements M5 and M6 are turned on, the fourth switching element M4 may be diode-connected so that the second power voltage VSS may be output as the first output signal at the first node N1. During this time, the first capacitive element C1 may store the threshold voltage of the fourth switching element M4 to compensate for the threshold voltage that may be lost when the second power voltage VSS is to be output to the first node N1 such that the second power voltage VSS may be output to the first node N1.

In the second signal processor 402 (referring to FIG. 3) during the first driving period T1, when the negative clock signal CLKB is at a high level, the first output signal may be output as the second output signal of the second node N2. That is, when the seventh switching element M7 and the twelfth switching element M12 are turned off, the first power voltage VDD and the second power voltage VSS may not be output to the second node N2. During this time, if the first and second nodes N1 and N2 are connected to each other, the same value output at the first node N1 may be output to the second node N2.

In the third signal processor 403, during the first driving period T1, the thirteenth switching element M13 and the fifteenth switching element M15 may be turned on, and the fourteenth switching element M14 may be turned off. When the thirteenth switching element M13 is turned on, the first power voltage VDD may be output to the third node N3.

In the fourth signal processor 404 during the first driving period T1, the seventeenth switching element M17 may be turned on, and the sixteenth switching element M16 may be turned off. When the seventeenth switching element M17 is turned on, the second power voltage VSS mat be output to the fourth node N4.

In the fifth signal processor 405 during the first driving period T1, the eighteenth switching element M18 may be turned on, and the nineteenth switching element M19 may be turned off. When the eighteenth switching element M18 is turned on, the first power voltage VDD may be output to the fifth node N5.

Next, during a second driving period T2, the clock signal CLK may be at a high level, the negative clock signal CLKB may be at a low level, the input signal IN may be at a low level, and the negative input signal INB may be at a high level.

In the first signal processor 401, during the second driving period T2, when the clock signal CLK is at the high level, the first switching element M1 and the sixth switching element M6 may be turned off. Accordingly, the first and second power voltages VDD, VSS may not be output to the first node N1. During this time, if the first node N1 is electrically coupled to the second node N2, the same value output to the first node N1 may be output to the second node N2.

In the second signal processor 402, during the second driving period T2, the seventh switching element M7 and the twelfth switching element M12 may be turned on, and the eighth switching element M8 and the ninth switching element M9 may be turned off. If the eleventh switching element M11 and the twelfth switching element M12 are turned on, the tenth switching element M10 may be coupled in a diode-connected manner, and the second power voltage VSS may be applied to the second node N2. During this time, the second capacitive element C2 may store the threshold voltage of the tenth switching element M10 and may compensate for the threshold voltage that is lost when the second power voltage VSS is applied.

In the third signal processor 403, during the second driving period T2, the thirteenth switching element M13 and the fourteenth switching element M14 may be turned on, and the fifteenth switching element M15 may be turned off. When the thirteenth switching element M13 is turned on, the first power voltage VDD may be applied to the third node N3. During this time, if the fifteenth switching element M15 did not exist, i.e., is not provided, the first and second power voltages VDD and VSS may be simultaneously applied to the third node N3. Such a simultaneous supply of the first and second power voltages VDD, VSS may be prevented by electrically coupling the fifteenth switching element M15 between the fourteenth switching element M14 and the second power voltage VSS.

In the fourth signal processor 404, during the second driving period T2, the seventeenth switching element M17 may be turned on, and the sixteenth switching element M16 may be turned off. When the seventeenth switching element M17 is turned on, the second power voltage VSS may be output to the fourth node N4.

In the fifth signal processor 405, during the second driving period T2, the 18th switching element M18 may be turned on, and the nineteenth switching element M19 may be turned off. When the eighteenth switching element M18 is turned on, the first power voltage VDD may be output to the fifth node N5.

Next, during a third driving period T3, the clock signal CLK may be at a low level, the negative clock signal CLKB may be at a high level, the input signal IN may be at a low level, and the negative input signal INB may be at a high level.

In the first signal processor 401, during the second driving period T3, the first, second, third and sixth switching elements M1, M2, M3 and M6 may be turned on, and the fifth switching element M5 may be turned off. When the first and second switching elements M1 and M2 are turned on, the first power voltage VDD may be output to the first node N1. When the third switching element M3 is turned on, the fourth switching element M4 may be connected in a diode-connected manner. As a result, the voltage supplied from the second power voltage VSS source may be prevented from being input to the fourth switching element M4.

In the second signal processor 402, during the third driving period T3, the negative clock signal CLKB is at a high level and the first output signal of the first node N1 may be output to the second node N2. More particularly, as a result of the negative clock signal CLKB being at a high level, the seventh switching element M7 and the twelfth switching element M12 may be turned off, and the first and second power voltages VDD and VSS may not be output to the second node N2. During this time, because the first node N1 is connected to the second node N2, the second node N2 may have and may output the same value as the first node N1.

In the third signal processor 403, during the third driving period T3, the fourteenth switching element M14 and the fifteenth switching element M15 may be turned on, and the thirteenth switching element M13 may be turned off. When the fourteenth and fifteenth switching elements M14 and M15 are turned on, the second power voltage VSS may be applied to the third node N3.

In the fourth signal processor 404, during the third driving period T3, the sixteenth switching element M16 may be turned on, and the seventeenth switching element M17 may be turned off. When the sixteenth switching element M16 is turned on, the first power voltage VDD may be output to the fourth node N4.

In the fifth signal processor 405, during the third driving period T3, the nineteenth switching element M19 may be turned on, and the eighteenth switching element M18 may be turned off. When the nineteenth switching element M19 is turned on, the second power voltage VSS may be output to the fifth node N5. During this time, the third capacitive element C3 may store a voltage difference between a gate and a source of the nineteenth switching element M19. The voltage difference between the gate and the source of the 19th switching element M19 may be equal to a voltage between the third node N3 and the fifth node N5 and may be stored in the third capacitive element C3, so that the second power voltage VSS may be output by compensating for the voltage that is lost when the second power voltage VSS is output.

If a pulse width of the input signal IN is lengthened by the operation of the first through fifth signal processors 401, 402, 403, 404 and 405, a pulse width of the output signal OUT may be lengthened. Also, if a pulse width of the input signal IN is shortened, the pulse width of the output signal OUT may be shortened. A number of pulses of the input signal IN may be the same as that of the output signal OUT, thereby allowing a pulse width and number of the light emitting control signals to be controlled using the input signal IN. In embodiments of the invention, a pulse width of the input signal IN may be larger than one cycle of the clock signal.

Figure 5:
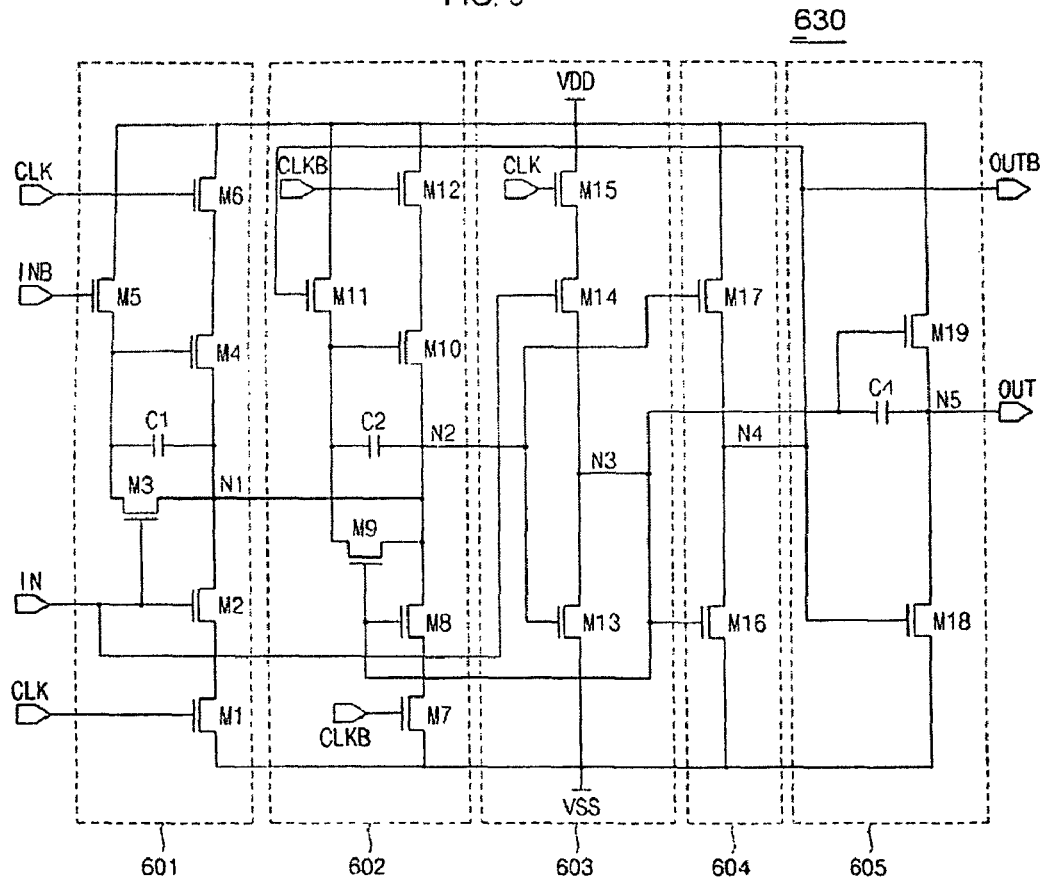
FIG. 5 illustrates a circuit diagram of a light emitting control driver according to another exemplary embodiment of the present invention.

FIG. 5 illustrates a circuit diagram of a light emitting control driver 630 according to another exemplary embodiment of the present invention.

Referring to FIG. 5, the light emitting control driver 630 may include a first signal processor 601, a second signal processor 602, a third signal processor 603, a fourth signal processor 604 and a fifth signal processor 605. In the exemplary embodiment illustrated in FIG. 5, each switching element included in the signal processors 601, 602, 603, 604 and 605 is implemented with a NMOS transistor. Other than turning on in response to a "high level" signal thereto and turning off in response to a "low level" signal supplied thereto, operation of each signal processors 601, 602, 603, 604 and 605 is substantially the same as that of the signal processors 401, 402, 403, 404 and 405 of FIG. 3.

As described above and illustrated in, e.g., FIGS. 3 and 5, embodiments of the invention may provide a light emitting control driver, e.g., 430, 630, and a pixel circuit, e.g., 140, that include transistor(s) of a same type, e.g., n-type transistors or p-type transistors, which may be formed on the same substrate, and thus, a manufacturing process thereof may be simplified.

In embodiments of the invention, a polycrystalline silicon transistor, e.g., NMOS poly-silicon TFT(s) or PMOS poly-silicon TFT(s), may be employed. In such cases, crystallization of, e.g., an amorphous silicon thin film may be performed using, e.g., excimer laser crystallization (ELA) using an excimer laser, metal induced crystallization (MIC) using a promoting material, and/or solid phase crystallization (SPC). Additionally, crystallization of the amorphous silicon of the TFT(s) may include sequential lateral solidification (SLS) using a mask, e.g., a chevron patterned mask, in the conventional excimer-laser crystallization method.

Among the methods for crystallizing an amorphous silicon layer of TFT(s) into poly silicon, excimer laser crystallization has been mainly used. Excimer laser crystallization may be performed at a relatively low temperature, and the process is relatively simple. Further, technology for the excimer laser crystallization has already been developed.

Metal induced crystallization (MIC) is another of the crystallization methods capable of being carried out at a low temperature. Metal induced crystallization (MIC) deposits or spin-coats a metal thin film acting as a catalyst for crystallization, e.g., Ni, Co, Pd and Ti, to enable the metal catalyst to directly penetrate into a surface of the amorphous silicon (a-Si) and crystallize while a phase of the amorphous silicon is changed.

Further, metal induced crystallization (MIC) may maximally restrain a contaminant such as nickel silicide on a specific region of the thin film transistor using a mask, when a metal layer is formed on the surface of the amorphous silicon. Metal induced lateral crystallization (MILC) induces lateral, sequential crystallization by reacting a metal with silicon to form silicide. Little, if any, of the metal used for crystallization may remain in the semiconductor active layer, and the resulting crystals generally have a small size and are highly ordered. Metal induced crystallization (MIC) may use a shadow mask as the mask. The shadow mask may be a line-type mask or a dot type mask.

Further, MIC may deposit a capping layer, when a metal catalyst layer is deposited or spin-coated on the surface of the amorphous silicon, so that a catalytic amount of the metal induced to the amorphous silicon may be controlled. Such MIC is referred to as metal induced crystallization with a capping layer (MICC). The capping layer may be a silicon nitride film. The catalytic amount of the metal induced from the metal catalyst layer to the amorphous silicon may be different according to thickness of the silicon nitride film. The metal catalyst induced into the silicon nitride film may be wholly formed on the silicon nitride film, and selectively formed using the shadow mask.

The amorphous silicon may be crystallized into poly silicon by the metal catalyst layer and then, the capping layer may be selectively removed. The capping layer may be removed using wet etching or dry etching. Additionally, after the poly silicon is formed, a gate insulation film may be formed and then, a gate electrode may be formed on the gate insulation film. An interlayer insulation film may be formed on the gate electrode. After forming a via hole on the interlayer insulation film, impurities may be injected into the poly silicon crystallized through the via hole so as to enable the metal catalytic impurities in the inside of the poly silicon to be removed. This is referred to as "gettering process". The gettering process may include a process of injecting the impurities and a heating process of heating the thin film transistor at a low temperature. The gettering process may provide a good quality TFT.

Embodiments of the invention provide a light emitting driver employing a single transistor type, e.g., n-type or p-type transistor(s), such that both a light emitting driver and a pixel circuit may be implemented with only a single transistor type, e.g., only n-type transistor(s) or only p-type transistor(s), thereby reducing processing cost and processing time, and improving yield.

Embodiments of the invention separately provide a light emitting control driver that may reduce and/or eliminate power loss and/or heat generation by using a switching element for controlling a path between a first power source and a second power source so as to prevent a first source voltage and a second power source voltage from being simultaneously applied.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A driver of an electroluminescence display, comprising:
   a first signal processor adapted to receive a clock signal, an input signal and a negative input signal and to output a first output signal to a first node;
   a second signal processor adapted to receive the first output signal, a negative clock signal, a first negative feedback signal and a second negative feedback signal and to output a second output signal to a second node;
   a third signal processor adapted to receive the second output signal, the input signal and the clock signal and to output a third output signal to a third node;
   a fourth signal processor adapted to receive the second and third output signals and to output a fourth output signal to a fourth node; and
   a fifth signal processor adapted to receive the third and fourth output signals and to output a fifth output signal to a fifth node,
   wherein the third signal processor includes a switching element for preventing first and second power voltages from being applied to the third node simultaneously.

2. The driver as claimed in claim 1, wherein the first negative feedback signal is the third output signal.

3. The driver as claimed in claim 1, wherein the second negative feedback signal is the fourth output signal.

4. The driver as claimed in claim 1, wherein the first output signal is output only when the clock signal is an enable signal.

5. The driver as claimed in claim 1, wherein the second output signal is output only when the negative clock signal is an enable signal.

6. The driver as claimed in claim 1, wherein the first, second, third, fourth and fifth signal processors are electrically coupled between the first and second power voltages.

7. The driver as claimed in claim 1, wherein the fifth output signal is an output signal of the driver.

8. The driver as claimed in claim 1, wherein the fourth output signal is a negative output signal of the driver.

9. The driver as claimed in claim 1, wherein the first signal processor comprises:
a first switching element adapted to selectively supply the first power voltage based on the clock signal;
a second switching element adapted to receive the input signal at a control electrode thereof to transfer the first power voltage supplied from the first switching element to the first node;
a third switching element adapted to receive the input signal at a control electrode thereof;
a first capacitive element including a first electrode that is electrically coupled to a first electrode of the third switching element and a second electrode that is electrically coupled to a second electrode of the third switching element;
a fourth switching element including a control electrode that is electrically coupled to the first electrode of the third switching element and the first electrode of the first capacitive element and adapted to selectively transfer the second power voltage to the first node;
a fifth switching element adapted to receive the negative input signal at a control electrode thereof and to selectively transfer the second power voltage to the control electrode of the fourth switching element; and
a sixth switching element adapted to transfer the second power voltage to the fourth switching element based on the clock signal,
wherein when the third switching element is in an on-state, the fourth switching element is in a diode-connected state.

10. The driver as claimed in claim 1, wherein the second signal processor comprises:
a seventh switching element adapted to selectively supply the first power voltage based on the negative clock signal;
an eighth switching element adapted to receive the third output signal at a control electrode thereof and to transfer the first power voltage supplied from the seventh switching element to the second node;
a ninth switching element adapted to receive the third output signal at a control electrode thereof;
a second capacitive element including a first electrode that is electrically coupled to a first electrode of the ninth switching element and a second electrode that is electrically coupled between a second electrode of the ninth switching element and the first node;
a tenth switching element including a control electrode coupled to the first electrode of the ninth switching element and the first electrode of the second capacitive element and adapted to selectively transfer the second power voltage to the second node;
an eleventh switching element adapted to receive the fourth output signal at a control electrode thereof and to transfer the second power voltage to the control electrode of the tenth switching element; and
a twelfth switching element adapted to selectively transfer the second power voltage to the tenth switching element based on the negative clock signal, wherein when the ninth switching element is in an on-state, the tenth switching element is in a diode-connected state.

11. The driver as claimed in claim 1, wherein the third signal processor comprises:

a thirteenth switching element adapted to receive the second output signal at a control electrode thereof and to selectively transfer the first power voltage to the third node;
a fourteenth switching element adapted to receive the input signal at a control electrode thereof and to selectively transfer the second power voltage to the third node; and
a fifteenth switching element adapted to selectively transfer the second power voltage to the fourteenth switching element.

12. The driver as claimed in claim 11, wherein the fifteenth switching element prevents the first and second power voltages from being simultaneously applied to the third node.

13. The driver as claimed in claim 1, wherein the fourth signal processor comprises:
a sixteenth switching element adapted to receive the third output signal at a control electrode thereof and to selectively transfer the first power voltage to the fourth node; and
a seventeenth switching element adapted to receive the input signal at a control electrode thereof and to selectively transfer the second power voltage to the fourth node.

14. The driver as claimed in claim 1, wherein the fifth signal processor comprises:
an eighteenth switching element adapted to receive the fourth output signal at a control electrode thereof and to selectively transfer the first power voltage to the fifth node;
a nineteenth switching element adapted to receive the third output signal at a control electrode thereof and to selectively transfer the second power voltage to the fifth node; and
a third capacitive element including a first electrode that is electrically coupled to the control electrode of the nineteenth switching element and a second electrode that is electrically coupled between a first electrode of the nineteenth switching element and the fifth node.

15. The driver as claimed in claim 1, wherein the first, second, third, fourth and fifth signal processors include a plurality of switching elements that are all implemented as p-type transistor or n-type transistors.

16. The driver as claimed in claim 1, wherein:
the clock signal is one of a low level or a high level and the negative clock signal is the other of the low level or the high level such that the clock signal and the negative clock signal are opposite to each other, and
the input signal is one of a low level or a high level and the negative input signal is the other of the low level or the high level such that the input signal and the negative input signal are opposite to each other.

17. The driver as claimed in claim 1, wherein the driver is a light emitting control driver of the electroluminescent display.

18. An organic electroluminescent display, comprising:
a data driver supplying a data signal to a data line;
a scan driver supplying a scan signal to a scan line;
a light emitting control driver supplying a light emitting signal to a light emitting control line;
a pixel circuit displaying an image using a pixel in a region that is defined by the data line, the scan line and the light emitting signal line; and
wherein the light emitting control driver, includes:
a first signal processor adapted to receive a clock signal, an input signal and a negative input signal and to output a first output signal to a first node;

a second signal processor adapted to receive the first output signal, a negative clock signal, a first negative feedback signal and a second negative feedback signal and to output a second output signal to a second node;

a third signal processor adapted to receive the second output signal, the input signal and the clock signal and to output a third output signal to a third node;

a fourth signal processor adapted to receive the second and third output signals and to output a fourth output signal to a fourth node; and a fifth signal processor adapted to receive the third and fourth output signals and to output a fifth output signal to a fifth node, wherein the third signal processor includes a switching element for preventing first and second power voltages from being applied to the third node simultaneously.

19. The organic electroluminescent display as claimed in claim 18, wherein the light emitting control driver includes a plurality of switching elements that are of a same transistor-type as a switching element of the pixel circuit.

20. The organic electroluminescent display as claimed in claim 18, wherein the first signal processor comprises:
a first switching element adapted to selectively supply the first power voltage based on the clock signal;
a second switching element adapted to receive the input signal at a control electrode thereof to transfer the first power voltage supplied from the first switching element to the first node;
a third switching element adapted to receive the input signal at a control electrode thereof;
a first capacitive element including a first electrode that is electrically coupled to a first electrode of the third switching element and a second electrode that is electrically coupled to a second electrode of the third switching element;
a fourth switching element including a control electrode that is electrically coupled to the first electrode of the third switching element and the first electrode of the first capacitive element and adapted to selectively transfer the second power voltage to the first node;
a fifth switching element adapted to receive the negative input signal at a control electrode thereof and to selectively transfer the second power voltage to the control electrode of the fourth switching element; and
a sixth switching element adapted to transfer the second power voltage to the fourth switching element based on the clock signal,
wherein when the third switching element is in an on-state, the fourth switching element is in a diode-connected state.

21. The organic electroluminescent display as claimed in claim 18, wherein the second signal processor comprises:
a seventh switching element adapted to selectively supply the first power voltage based on the negative clock signal;
an eighth switching element adapted to receive the third output signal at a control electrode thereof and to transfer the first power voltage supplied from the seventh switching element to the second node;
a ninth switching element adapted to receive the third output signal at a control electrode thereof;

a second capacitive element including a first electrode that is electrically coupled to a first electrode of the ninth switching element and a second electrode that is electrically coupled between a second electrode of the ninth switching element and the first node;

a tenth switching element including a control electrode electrically coupled to the first electrode of the ninth switching element and the first electrode of the second capacitive element and adapted to selectively transfer the second power voltage to the second node;

an eleventh switching element adapted to receive the fourth output signal at a control electrode thereof and to transfer the second power voltage to the control electrode of the tenth switching element; and a twelfth switching element adapted to selectively transfer the second power voltage to the tenth switching element based on the negative clock signal, wherein when the ninth switching element is in an on-state, the tenth switching element is in a diode-connected state.

22. The organic electroluminescent display as claimed in claim 18, wherein the third signal processor comprises:
a thirteenth switching element adapted to receive the second output signal at a control electrode thereof and to selectively transfer the first power voltage to the third node;
a fourteenth switching element adapted to receive the input signal at a control electrode thereof and to selectively transfer the second power voltage to the third node; and
a fifteenth switching element adapted to selectively transfer the second power voltage to the fourteenth switching element.

23. The organic electroluminescent display as claimed in claim 22, wherein the fifteenth switching element prevents the first and second power voltages from being simultaneously applied to the third node.

24. The organic electroluminescent display as claimed in claim 18, wherein the fourth signal processor comprises:
a sixteenth switching element adapted to receive the third output signal at a control electrode thereof and to selectively transfer the first power voltage to the fourth node; and
a seventeenth switching element adapted to receive the input signal at a control electrode thereof and to selectively transfer the second power voltage to the fourth node.

25. The organic electroluminescent display as claimed in claim 18, wherein the fifth signal processor comprises:
an eighteenth switching element adapted to receive the fourth output signal at a control electrode thereof and to selectively transfer the first power voltage to the fifth node;
a nineteenth switching element adapted to receive the third output signal at a control electrode thereof and to selectively transfer the second power voltage to the fifth node; and
a third capacitive element including a first electrode that is electrically coupled to the control electrode of the nineteenth switching element and a second electrode that is electrically coupled between a first electrode of the nineteenth switching element and the fifth node.

* * * * *